US008027172B2

United States Patent
Chen et al.

(10) Patent No.: US 8,027,172 B2
(45) Date of Patent: *Sep. 27, 2011

(54) HANDHELD ELECTRONIC DEVICE INCLUDING MULTI-COMPARTMENT SHIELDING CONTAINER AND ASSOCIATED METHODS

(75) Inventors: Chao Chen, Waterloo (CA); Douglas Fregin, Waterloo (CA); Jana Regenwetter, Milton (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/939,068

(22) Filed: Nov. 3, 2010

(65) Prior Publication Data

US 2011/0041316 A1    Feb. 24, 2011

Related U.S. Application Data

(60) Continuation of application No. 12/368,837, filed on Feb. 10, 2009, now Pat. No. 7,830,673, which is a division of application No. 11/465,487, filed on Aug. 18, 2006, now Pat. No. 7,508,684.

(51) Int. Cl.
  *H05K 9/00*    (2006.01)
(52) U.S. Cl. ......................... 361/816; 361/818
(58) Field of Classification Search .................. 361/816, 361/818, 800, 799, 794; 174/250–255, 35 R, 174/51
See application file for complete search history.

(56) References Cited

U.S. PATENT DOCUMENTS

| 5,335,147 | A | 8/1994 | Weber | 361/818 |
|---|---|---|---|---|
| 5,508,889 | A | 4/1996 | Li | 361/816 |
| 5,536,905 | A | 7/1996 | Redman et al. | 174/35 |
| 5,731,964 | A | 3/1998 | Kitakubo et al. | 361/816 |
| 5,748,455 | A | 5/1998 | Phillips et al. | 361/818 |
| 5,774,344 | A | 6/1998 | Casebolt | 361/800 |
| 5,883,791 | A | 3/1999 | Deguchi | 361/818 |
| 5,895,884 | A | 4/1999 | Davidson | 174/35 |
| 6,058,018 | A | 5/2000 | Gerrits et al. | 361/737 |
| 6,121,544 | A | 9/2000 | Petsinger | 174/35 |
| 6,121,546 | A | 9/2000 | Erickson et al. | 174/366 |
| 6,137,051 | A | 10/2000 | Bundza | 174/35 |
| 6,181,573 | B1 | 1/2001 | Riet | 361/816 |
| 6,600,663 | B1 | 7/2003 | Koleda | 361/816 |
| 6,967,280 | B1 | 11/2005 | Boatwright et al. | 174/35 |
| 7,061,773 | B2 | 6/2006 | Chen | 361/816 |
| D548,378 | S | 8/2007 | Handsaker et al. | D26/31 |
| D549,706 | S | 8/2007 | Doyle et al. | D14/432 |
| 7,830,673 | B2 * | 11/2010 | Chen et al. | 361/818 |

FOREIGN PATENT DOCUMENTS
DE    29913199    1/2000
* cited by examiner

*Primary Examiner* — Hung S Bui
(74) *Attorney, Agent, or Firm* — Allen, Dyer, Doppelt, Milbrath & Gilchrist, P.A.

(57) ABSTRACT

A handheld electronic device may include a portable housing and a shielding container within the portable housing. The shielding container may include a shielding frame and a shielding lid carried thereby. A printed circuit board may be within the shielding container. The shielding frame may include a planar base with at least one opening therein, a pair of opposing side walls integrally formed with the base and extending upwardly therefrom, and a pair of opposing end walls integrally formed with the base and extending upwardly therefrom. Also, the shielding frame may include at least one intermediate partition wall integrally formed with the base and extending upwardly therefrom to define a plurality of container compartments. The partition wall may also extend only partway between the opposing side walls to define at least one partition end gap therewith.

22 Claims, 8 Drawing Sheets

HANDHELD ELECTRONIC DEVICE INCLUDING MULTI-COMPARTMENT SHIELDING CONTAINER AND ASSOCIATED METHODS

CROSS-REFERENCE TO RELATED APPLICATION

This application is continuation of Ser. No. 12/368,837 filed Feb. 10, 2009, now U.S. Pat. No. 7,830,673 issued Nov. 9, 2010 which, in turn, is a divisional of Ser. No. 11/465,487 filed Aug. 18, 2006, now U.S. Pat. No. 7,508,684 issued Mar. 24, 2009, the entire disclosures of which are hereby incorporated herein by reference.

FIELD OF THE INVENTION

The present invention relates to the field of mobile communications, and, more particularly, to shielding within a mobile communication device and related methods.

BACKGROUND OF THE INVENTION

Cellular communication systems continue to grow in popularity and have become an integral part of both personal and business communications. Cellular telephones allow users to place and receive phone calls most anywhere they travel. Moreover, as cellular telephone technology has increased, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

As the functionality of cellular communications devices continues to increase, so too does the demand for smaller devices that are easier and more convenient for users to carry. As any circuit board and electronic components thereon are reduced in size and placed closer together, including antenna and microphone components, various electronic components can pick up energy and create interference within the system. For example, an internal surface mounted microphone could pick up energy directly from a power amplifier or from the radiated energy emitted by an antenna. This unwanted reception of energy from respective power amplifiers and antennae may be particularly problematic in a packet burst transmission as part of a Global System for Mobile communications (GSM) system, including the 450 MHz, 900 MHz, 1800 MHz and 1900 MHz frequency bands.

Other interfering signals can be generated when the liquid crystal display (LCD) in some mobile wireless communications devices radiates radio frequency (RF) interfering energy and degrades receiver sensitivity. This may be problematic where the interfering energy is generated by the microprocessor or central processing unit (CPU) of a wireless mobile communications device and fed into the LCD lines, along with interfering energy generated by the LCD itself. Other problems may occur when the interfering radio frequency (RF) energy is coupled to the mobile wireless communications device causing audio break through tests to fail for both the uplink and downlink. Even the keyboard circuits can create unwanted interference problems. For example, the radio frequency receiver sensitivity is often degraded by the electromagnetic interference (EMI) of digital harmonics from the microprocessor or CPU via the keyboard because of the resulting loop formed by any keyboard circuits. In some instances, strong RF energy, for example, such as the transmitted power from the radio via the antenna interferes with or couples to the microprocessor or CPU input/output (I/O) lines of a mobile wireless communications device through the keyboard Key-In and Key-Out lines and causes a reset of the microprocessor or CPU.

A shielding container can protect components on a printed circuit board (PCB), preferably for a cellular phone, against interference from other components due to electric fields. A shielding container covers a number of electronic components on a printed circuit board, and thereby protects these components from disturbing other electronic components on the printed circuit board. The use of shielding containers is well known because GSM phones have printed circuit boards equipped with different components that may disturb each other if they are not shielded from each other.

A first type of shielding container includes one entire box shaped piece soldered onto the printed circuit board. This type of shielding container does not permit access to components covered by the shielding container, which makes it very difficult to repair or inspect any of the components covered or shielded by the shielding container. An alternative is having holes or apertures to let the heat in to solder the components at the same time as the shielding container.

A second type of shielding container includes two pieces, one frame and one lid. The lid is snapped onto the frame and can be removed from the frame, which is soldered onto the printed circuit board, to enable repairing or inspection of the components shielded by the shielding can. The second type may be attached to the printed circuit board in different ways. One way is to solder the frame onto the printed circuit board first and then attach the lid to the frame. Another way is to snap the lid onto the frame and solder the assembly onto the printed circuit board, but then there is a need for holes or apertures in the lid to let in the heat during soldering. Otherwise the components covered or shielded by the shielding container will not be properly soldered since the heat cannot reach the components. It is preferable to solder the frame with the lid attached to save work operations. However, according to the prior art there may be problems getting a good solder joint, when using a pre-joined shielding container.

U.S. Pat. No. 5,895,884 to Davidson is directed to a shielding device with a push fit lid. The shielding device is formed from two unitary pieces, one of which is a generally planar member taking the form of a lid and the other piece takes the form of a side wall member which is adapted for mounting to a substrate surface on which is mounted circuit elements. The two pieces together combine to create the shielding device for inhibiting the passage of electromagnetic radiation to and/or from a group of circuit elements. The lid may have flanges for connection onto the side wall member and the side wall member may have intersecting dividing walls disposed internally thereof.

U.S. Pat. No. 6,600,663 to Koleda is directed to a shielding can for a printed circuit which includes a frame with side walls and a lid with increased flexibility from slits on the sides of the lid. These slits enable a flexible contraction, when soldering the shielding can onto the printed circuit board.

U.S. Pat. No. 6,137,051 to Bundza is directed to an electromagnetic interference and compatibility (FMS/EMC) shielding enclosure for a printed circuit board (PCB) or other electronic components that has a conductive plastic top housing portion and a conductive bottom housing portion. The top housing portion has projecting fingers integral therewith. The bottom housing portion has an inner surface with walls projecting therefrom for substantially encompassing the PCB.

When the enclosure is assembled, the PCB is located between the top housing portion and the bottom housing portion, the fingers from the top housing portion surround at least a major portion of the PCB and the fingers physically contact the bottom housing portion or are sufficiently close for capacitive coupling.

There is still a need for a handheld electronic device including a multi-compartment shielding container with inter-compartment shielding and sufficient stiffness to be used for printed circuit boards within the electronic device.

DETAILED DESCRIPTION OF THE PREFERRED EMBODIMENTS

Figure 1:
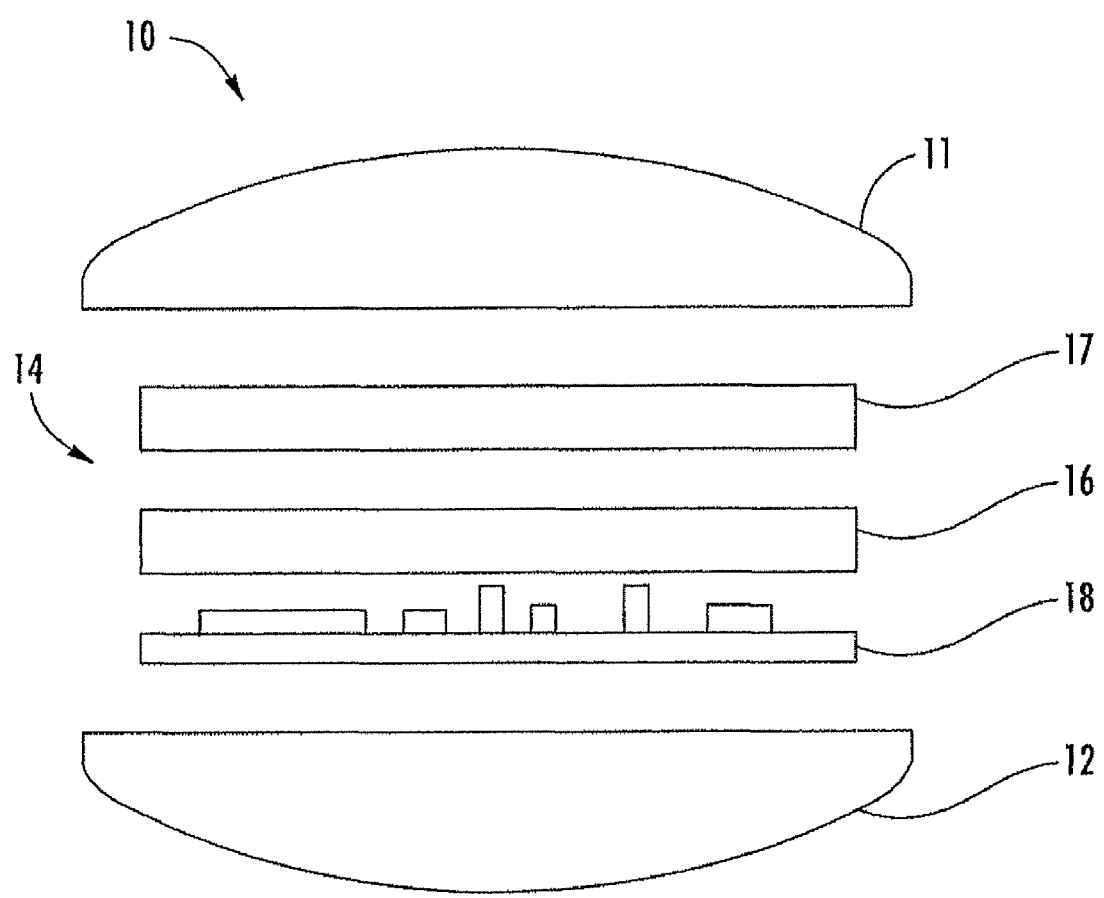
FIG. 1 is an exploded end view of a handheld electronic device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

In view of the foregoing background, it is therefore an object of the present invention to provide a handheld electronic device including a multi-compartment shielding container with inter-compartment shielding and sufficient stiffness. This and other objects, features, and advantages in accordance with the present invention are provided by a handheld electronic device including a portable housing and a shielding container within the portable housing. The shielding container may include a shielding frame and a shielding lid carried thereby. A printed circuit board may be adjacent the shielding container. The shielding frame may include a base being generally planar and having at least one opening therein, a pair of opposing side walls integrally formed with the base and extending upwardly therefrom, and a pair of opposing end walls integrally formed with the base and extending upwardly therefrom. Also, the shielding frame may include at least one intermediate partition wall integrally formed with the base and extending upwardly therefrom to define a plurality of container compartments. The partition wall may extend only partway between the opposing side walls to define at least one partition end gap therewith.

Preferably, the pair of opposing side walls includes at least one side wall stiffening feature incorporated therein. For example, the stiffening feature may be desired for an embodiment where a keyboard is on the backside of the printed circuit board to prevent unnecessary stress on the board and thus avoid solder cracking, etc. The at least one partition end gap may comprise a pair thereof, and the stiffening feature may include a respective stiffening feature adjacent each partition end gap. The side wall stiffening feature is preferably a radiused corner defined with adjacent portions of the base. For example, the radiused corner may have a radius of less than about 5 mm or have a radius in a range of about 0.2 to 1.0 mm. Also, each of the pair of partition end gaps may be less than about 1 mm to provide adequate shielding within the container compartments, and preferably is in a range of about 0.2 to 0.8 mm, and more preferably in a range of 0.5 to 0.7 mm.

The printed circuit board may be a wireless transceiver printed circuit board, for example. The at least one intermediate partition wall may include a plurality of intermediate partition walls in some embodiments. The shielding frame may be devoid of welded or soldered joints between adjacent portions thereof. In addition, the shielding container may comprise an electrically conductive material and the shielding lid may be substantially continuous.

A method aspect is directed to making a shielding container for at least one printed circuit board of a handheld electronic device. The method may include forming a shielding frame and forming a shielding lid carried by the shielding frame. Forming the shielding frame may include forming a planar base having at least one opening therein, integrally forming a pair of opposing side walls with the base and extending upwardly therefrom, and integrally forming a pair of opposing end walls with the base and extending upwardly therefrom. Also, the method may include integrally forming at least one intermediate partition wall with the base and extending upwardly therefrom to define a plurality of container compartments, the at least one partition wall may also extend only partway between the opposing side walls to define at least one partition end gap therewith. At least one side wall stiffening feature may be formed in the pair of opposing side walls.

The at least one partition end gap may comprise a pair thereof, and forming the at least one stiffening feature may include forming a respective stiffening feature adjacent each partition end gap. Forming the at least one side wall stiffening feature may include forming a radiused corner defined with adjacent portions of the base.

Referring initially to FIGS. 1-5, a handheld electronic device 10 illustratively includes a portable housing and a shielding container 14 within the portable housing comprising upper and lower housing portions 11, 12. Such a shielding container can protect components on a printed circuit board 18 against interference from other components due to electric fields. The shielding container 14 covers a number of electronic components on the printed circuit board, and thereby protects these components from disturbing other electronic components on the printed circuit board. The shielding container 14 includes a shielding frame 16 and a shielding lid 17 carried thereby. The shielding lid 17 may be substantially continuous and attached to the shielding frame 16 as will be appreciated by those skilled in the art. A plurality of tabs 19 are positioned along flanges of the shielding lid 17 to be aligned with attaching holes 21 along the opposing side walls 24, 26 and end walls 28, 30 of the shielding frame 16, discussed below, thereby securing the shielding lid 17 to the shielding frame 16. The printed circuit board 18 is adjacent the shielding container 14, such as a wireless transceiver printed circuit board, for example.

The shielding frame 16 includes a generally planar base 20 with a plurality of openings 22a-22d therein, a pair of opposing side walls 24, 26 integrally formed with the base and extending upwardly therefrom, and a pair of opposing end walls 28, 30 integrally formed with the base and extending upwardly therefrom. Also, the shielding frame 16 includes an intermediate partition wall 32 integrally formed with the base 20 and extending upwardly therefrom to define a pair, of container compartments 34, 36. The partition wall 32 extends only partway between the opposing side walls 24, 26 to define a pair of partition end gap 38, 40 therewith. In the illustrated embodiment, a second partition wail 39 may extend upwardly from the base 20 and define only a single partition end gap 41.

Each of the pair of partition end gaps 38, 40 may have a dimension d less than about 1 mm to provide adequate shielding within the container compartments yet facilitating manufacturing. The gap dimension d may preferably be in a range of about 0.2 to 0.8 mm, and more preferably in a range of 0.5 to 0.7 mm. Providing the pair of partition end gaps d in these ranges also contributes to the pair of opposing side walls 24, 26 imparting a sufficient stiffness to the shield frame 16.

Figure 3:
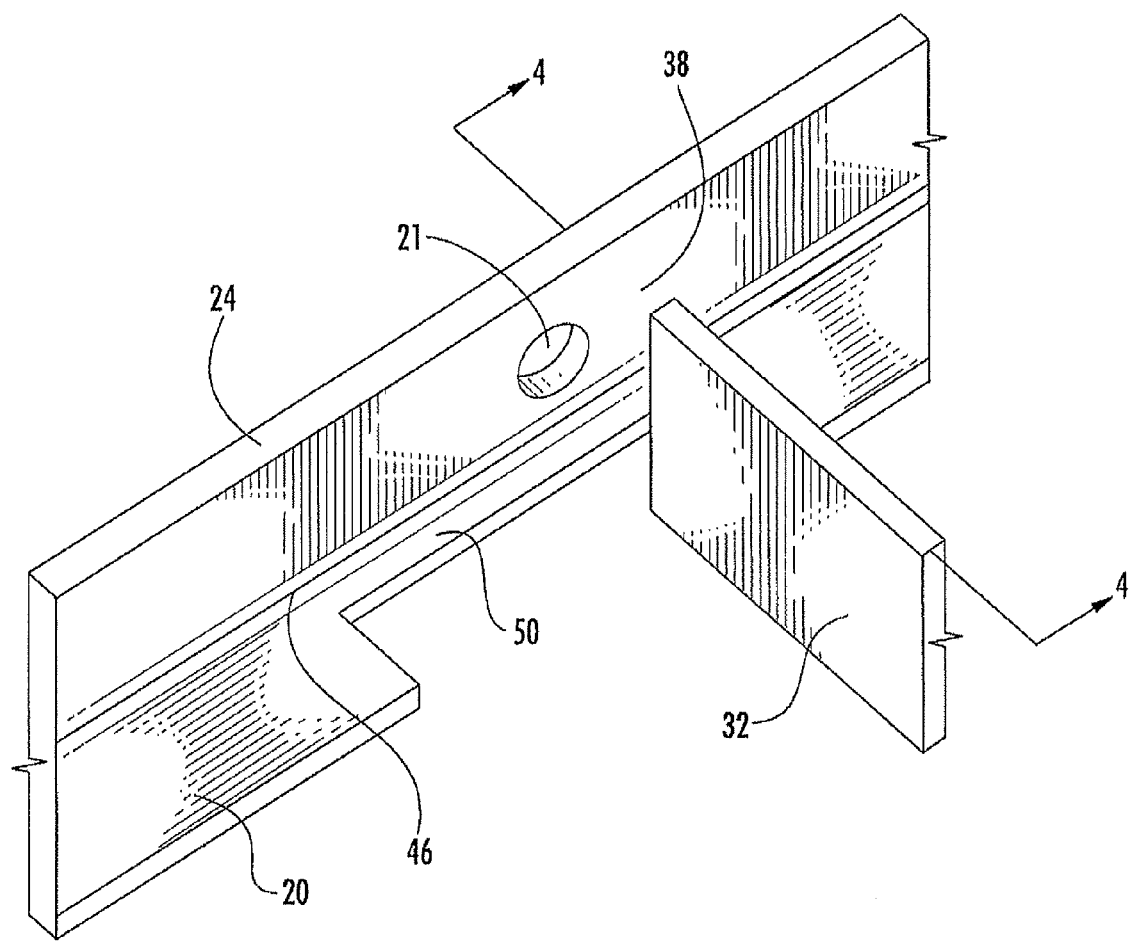
FIG. 3 is an enlarged perspective view of a portion of the shielding frame as shown in FIG. 2.
Figure 4:
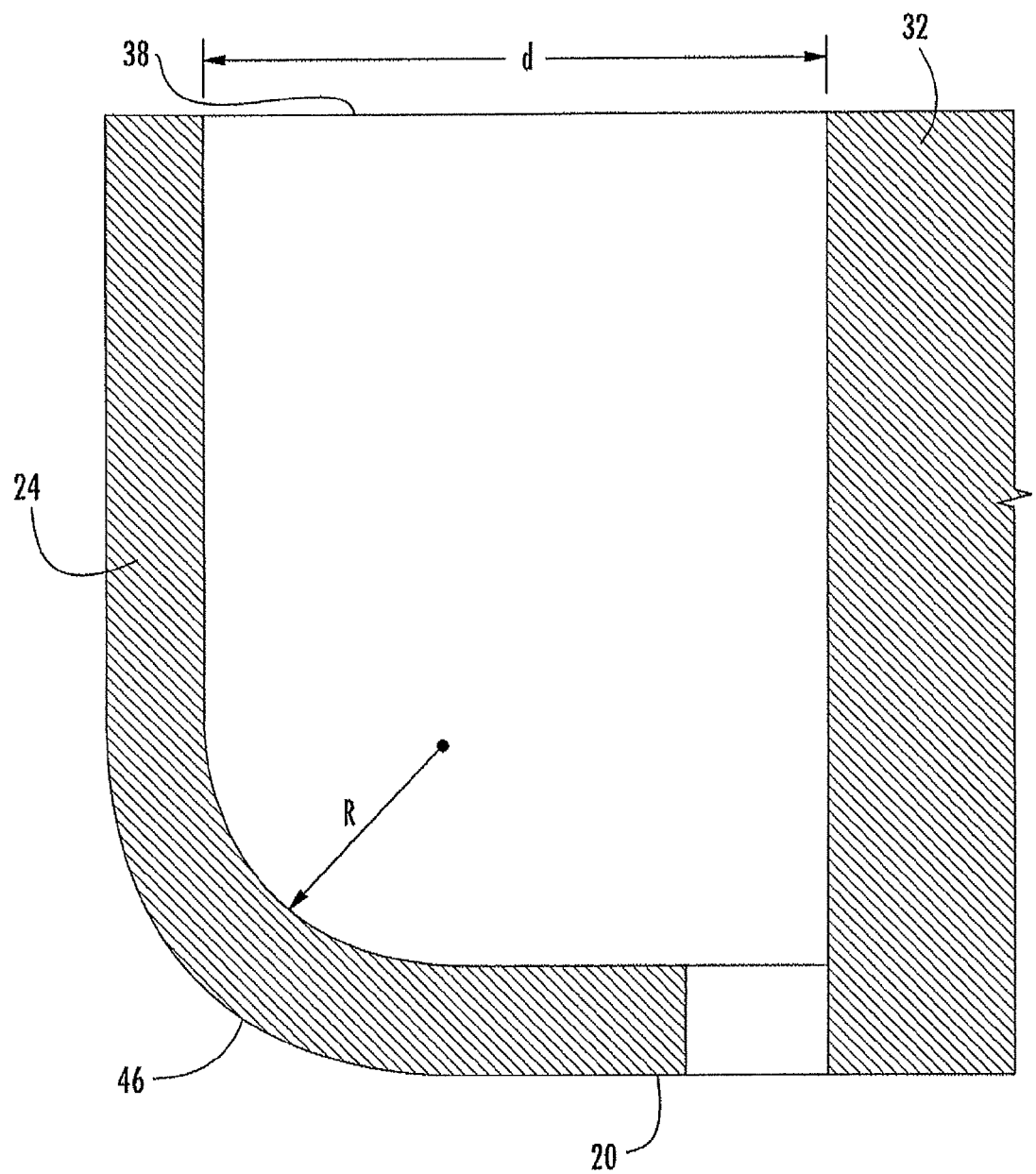
FIG. 4 is a cross-sectional view taken along the line 4-4 of FIG. 3.
Figure 5:
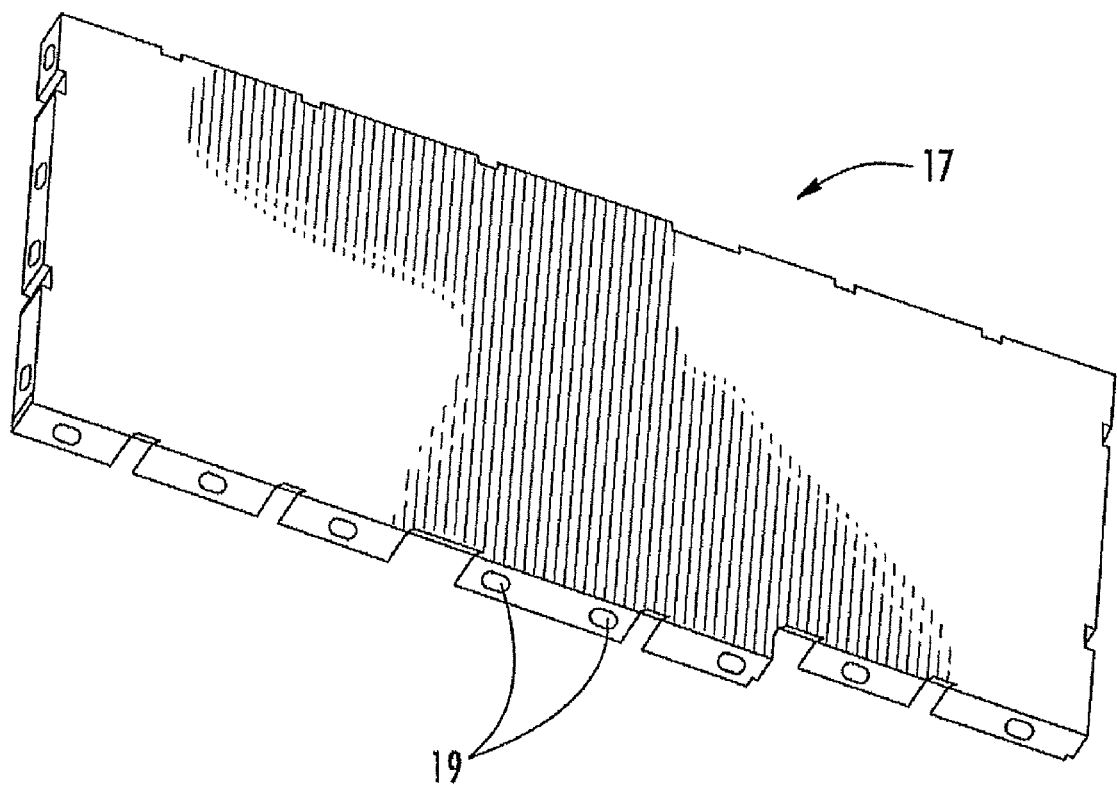
FIG. 5 is a perspective view of the shielding lid as shown in FIG. 1.

Referring more specifically to FIGS. 3 and 4, the pair of opposing side walls 24, 26 includes at least one side wall stiffening feature 50 incorporated therein, adjacent the partition end gap 38. The side wall stiffening feature is illustratively provided by a radiused corner 46 defined with adjacent portions of the base 20. For example, the radiused corner 46 may have a radius R of less than about 5 mm or have a radius in a range of about 0.2 to 1.0 mm. The radiused corner may be used adjacent the other partition end gaps, 40, 41 as will be appreciated by those skilled in the art. The stiffening features may help yield a sufficient co-planarity of the base 20, such as within 0.1~0.15 mm, for example, so to avoid the need to solder adjacent portions of the shielding frame 16, as will also be appreciated by those skilled in the art. Accordingly, the shielding frame 16 may be devoid of welded or soldered joints between adjacent portions thereof. The shielding container 14 may comprise an electrically conductive material such as a stamped and folded copper sheet. Furthermore, for example, the stiffening feature may be desired for an embodiment where a keyboard is on the backside of the printed circuit board to prevent unnecessary stress on the board and thus avoid solder cracking, etc.

Figure 2:
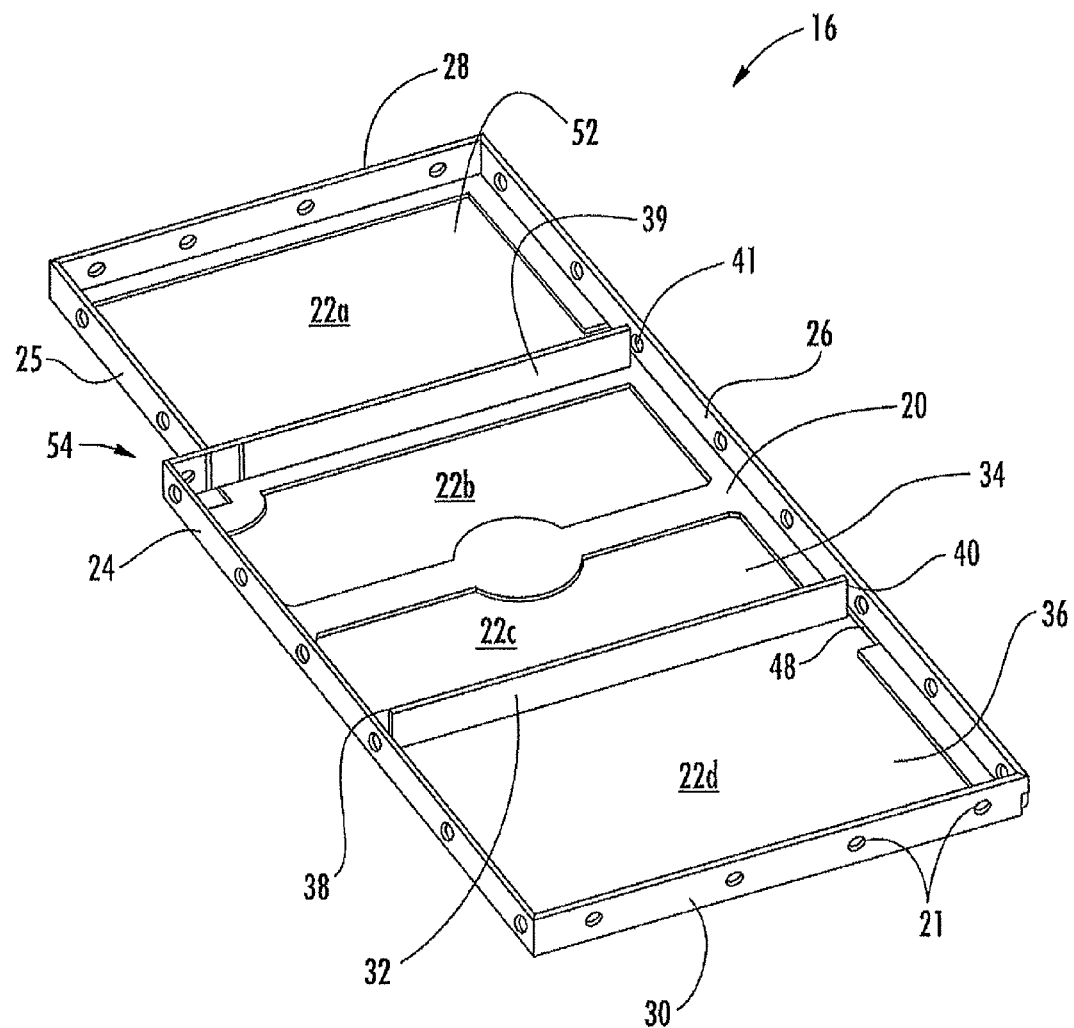
FIG. 2 is a perspective view of the shielding frame as shown in FIG. 1.
Figure 6:
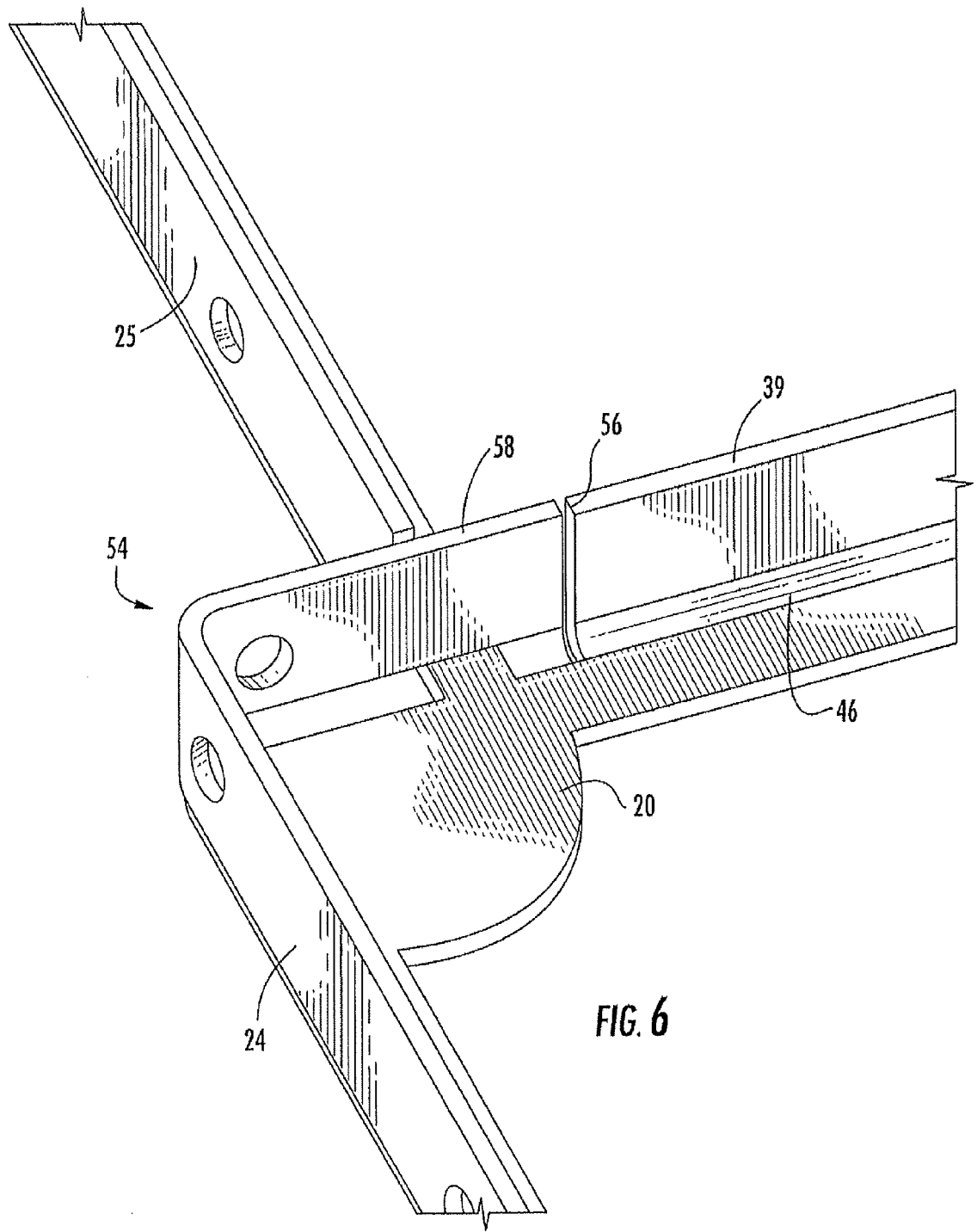
FIGS. 6 and 7 are enlarged views of embodiments of a wrap-around corner of the shielding frame as shown in FIG. 2.
Figure 7:
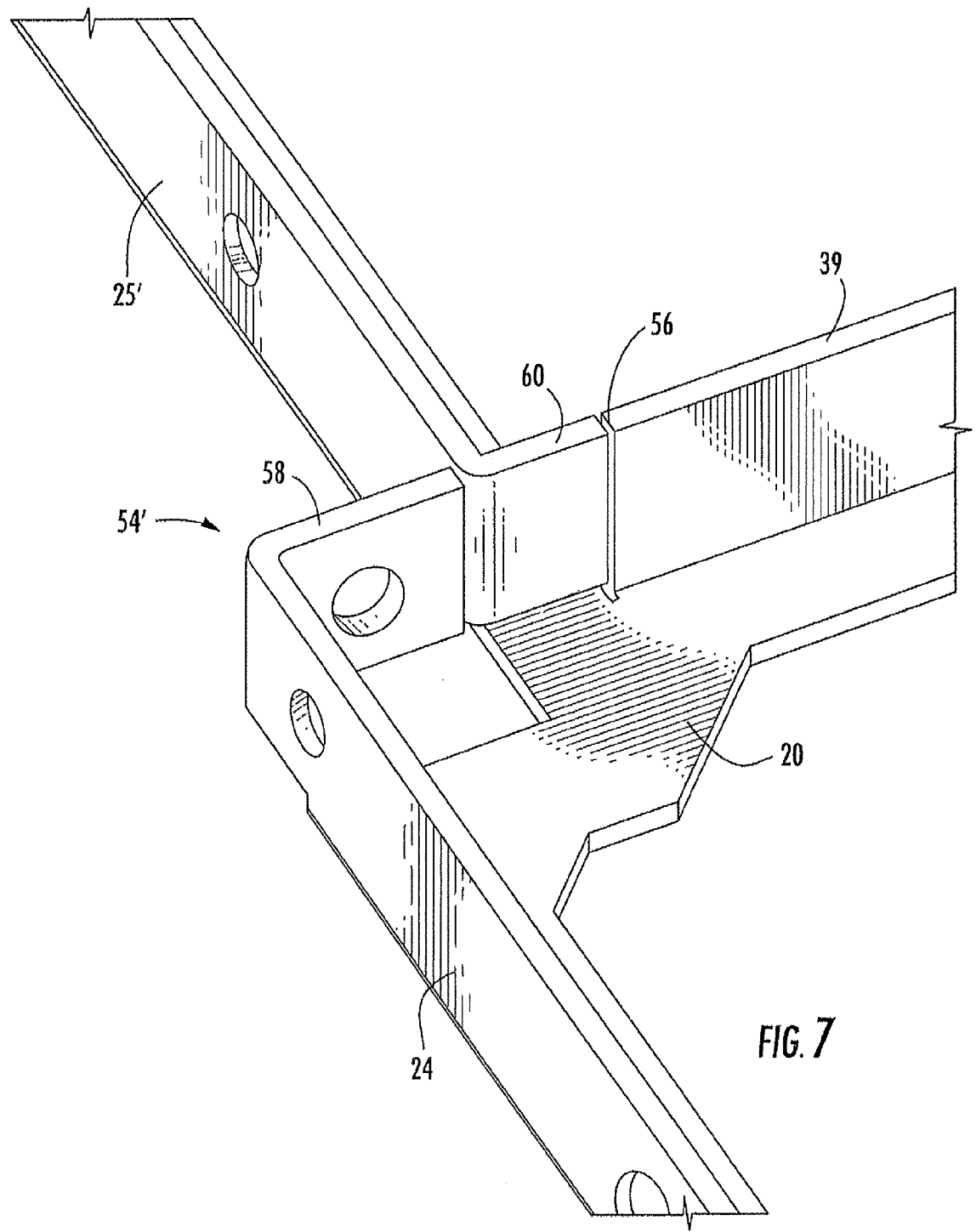

Referring more specifically to FIGS. 2, 6 and 7, the second partition wall 39, along with the offset side wall 25, may define a relatively smaller or more narrow container compartment 52. As such, a wrap-around corner 54 is defined between the second partition wall 39 and the side wall 24. The side wall 24 preferably includes a corner extension 58 that is perpendicular to the side wall 24 and in-line with the second partition wall 39. In one embodiment (FIG. 6), the corner extension 58 extends to adjacent the second partition wall 39 with a gap 56 therebetween. In an alternative embodiment (FIG. 7), the wrap-around corner 54' includes the corner extension 58 along with an offset side wall extension 60, of the offset side wall 25', between the corner extension 58 and the second partition wall 39. In this embodiment, the gap 56 is between the offset side wall extension 60 and the second partition wall 39. The embodiment illustrated in FIG. 6 also includes the radiused corner 46 as a stiffening feature defined between the second partition wall 39 and adjacent portions of the base 20.

A method aspect is directed to making a shielding container 14 for a printed circuit board 18 of a handheld electronic device 10. The method includes forming a shielding frame 16 and forming a shielding lid 17 carried by the shielding frame. Forming the shielding frame 16 includes forming a planar base 20 having at least one opening 22 therein, integrally forming a pair of opposing side walls 24, 26 with the base and extending upwardly therefrom, and integrally forming a pair of opposing end walls 28, 30 with the base and extending upwardly therefrom. Also, the method includes integrally forming an intermediate partition wall 32 with the base 20 and extending upwardly therefrom to define a plurality of container compartments 34, 36. The partition wall 32 may also extend only partway between the opposing side walls 24, 26 to define one or a pair of partition end gaps therewith.

One example of a hand-held mobile wireless communications device 1000 that may be used is further described in the example below with reference to FIG. 8. The device 1000 illustratively includes a housing 1200, a keypad 1400 and an output device 1600. The output device shown is a display 1600, which is preferably a full graphic LCD. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400 by the user.

The housing 1200 may be elongated vertically, or may take on other sizes and shapes (including clamshell housing structures). The keypad may include a mode selection key, or other hardware or software for switching between text entry and telephony entry.

Figure 8:
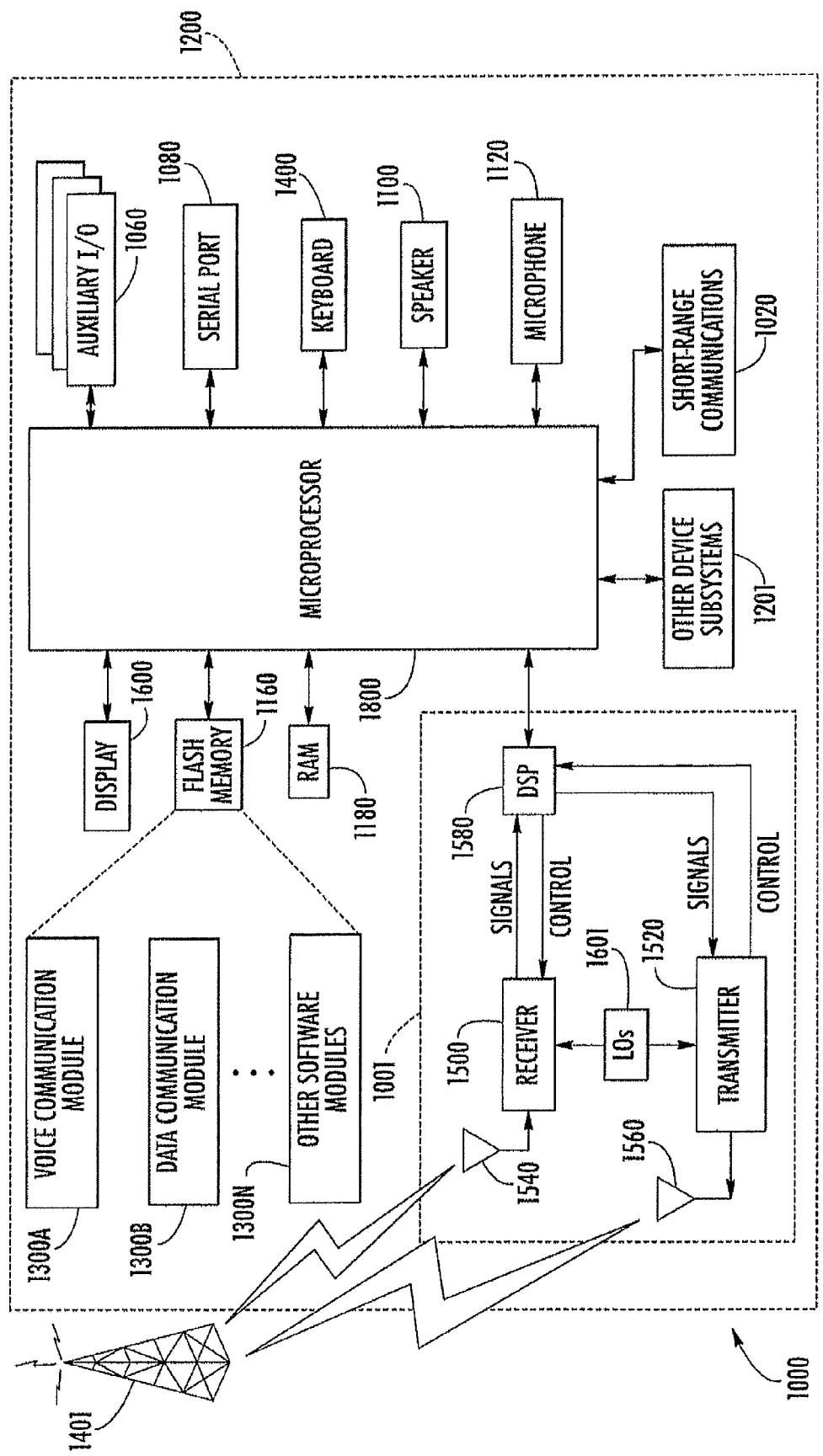
FIG. 8 is a more detailed schematic block diagram of an alternative embodiment of a handheld electronic device according to the invention.

In addition to the processing device 1800, other parts of the mobile device 1000 are shown schematically in FIG. 8. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 is preferably a two-way RF communications device having voice and data communications capabilities. In addition, the mobile device 1000 preferably has the capability to communicate with other computer systems via the Internet.

Operating system software executed by the processing device 1800 is preferably stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 1401. Preferably, the PIM data items are seamlessly integrated, synchronized and updated via the wireless network 1401 with the device user's corresponding data items stored or associated with a host computer system. Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (Las) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, PCS, GSM, etc. Other types of data and voice networks, both separate and integrated, may also be utilized with the mobile device 1000.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device user may also compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile, device 1000 and other proximate systems or devices, which need not necessarily be similar devices. For example, the short-range communications subsystem may include an infrared device and associated circuits and components, or a Bluetooth™ communications module to provide for communication with similarly-enabled systems and devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed:

1. A method for making a shielding container for electronic circuitry, the method comprising:
    forming a shielding frame by at least
        forming a pair of side walls and a pair of end walls extending upwardly from a base, and
        forming at least one intermediate partition wall extending upwardly from the base to define a plurality of container compartments, the at least one partition wall also extending only partway between the side walls to define at least one partition end gap therewith, and a wrap-around corner portion defined between the at least one intermediate partition wall and at least one side wall; and
    forming a shielding lid to be carried by the shielding frame.

2. The method according to claim 1 wherein the wrap-around corner portion is defined by at least one of the side walls, adjacent a respective partition end gap, including a corner extension that is perpendicular to the respective side wall and substantially parallel with the intermediate partition wall.

3. The method according to claim 1 further comprising forming at least one side wall stiffening feature in the pair of side walls.

4. The method according to claim 3 wherein the at least one partition end gap comprises a pair thereof; and
    wherein forming the at least one stiffening feature comprises forming a respective stiffening feature adjacent each partition end gap.

5. The method according to claim 4 wherein each of pair of partition end gaps is less than about 1 mm.

6. The method according to claim 4 wherein each of the pair of end partition gaps is in a range of about 0.2 to 0.8 mm.

7. The method according to claim 3 wherein forming the at least one side wall stiffening feature comprises forming a radiused corner defined with adjacent portions of the base.

8. The method according to claim 7 wherein the radiused corner has a radius of less than about 5 mm.

9. The method according to claim 7 wherein the radiused corner has a radius in a range of about 0.2 to 1.0 mm.

10. The method according to claim 1 wherein the at least one intermediate partition wall comprises a plurality of intermediate partition walls.

11. The method according to claim 1 wherein the shielding frame is devoid of welded or soldered joints between adjacent portions thereof.

12. The method according to claim 1 wherein the shielding container comprises an electrically conductive material.

13. The method according to claim 1 wherein the shielding lid is substantially continuous.

14. A method for making a shielding frame to carry a shielding lid to define a shielding container for electronic circuitry, the method comprising:
   forming a pair of side walls and a pair of end walls extending upwardly from a base; and
   forming at least one intermediate partition wall with extending upwardly from the base to define a plurality of container compartments, the at least one partition wall also extending only partway between the side walls to define at least one partition end gap therewith, and a wrap-around corner portion defined between the at least one intermediate partition wall and at least one side wall.

15. The method according to claim 14 wherein the wrap-around corner portion is defined by at least one of the side walls, adjacent a respective partition end gap, including a corner extension that is perpendicular to the respective side wall and substantially parallel with the intermediate partition wall.

16. The method according to claim 14 further comprising forming at least one side wall stiffening feature in the pair of side walls.

17. The method according to claim 16 wherein the at least one partition end gap comprises a pair thereof; and
   wherein forming the at least one stiffening feature comprises forming a respective stiffening feature adjacent each partition end gap.

18. The method according to claim 16 wherein forming the at least one side wall stiffening feature comprises forming a radiused corner defined with adjacent portions of the base.

19. The method according to claim 14 wherein the at least one intermediate partition wall comprises a plurality of intermediate partition walls.

20. The method according to claim 14 wherein the shielding frame is devoid of welded or soldered joints between adjacent portions thereof.

21. A method for making a shielding frame devoid of welded or soldered joints between adjacent portions thereof to carry a shielding lid to define a shielding container for electronic circuitry, the method comprising:
   forming a pair of side walls and a pair of end walls extending upwardly from a base;
   forming at least one intermediate partition wall extending upwardly from the base to define a plurality of container compartments, the at least one partition wall also extending only partway between the side walls to define at least one partition end gap therewith;
   forming at least one side wall stiffening feature in the pair of side walls defined by a radiused corner with adjacent portions of the base having a radius in a range of about 0.2 to 1.0 mm; and
   wherein the pair of side walls, pair of end walls, at least one intermediate partition wall, and at least one side wall stiffening feature are formed to be devoid of welded or soldered joints between adjacent portions thereof.

22. The method according to claim 21 wherein the at least one intermediate partition wall comprises a plurality of intermediate partition walls.

* * * * *

UNITED STATES PATENT AND TRADEMARK OFFICE
CERTIFICATE OF CORRECTION

| | | |
|---|---|---|
| PATENT NO. | : 8,027,172 B2 | Page 1 of 1 |
| APPLICATION NO. | : 12/939068 | |
| DATED | : September 27, 2011 | |
| INVENTOR(S) | : Chen et al. | |

It is certified that error appears in the above-identified patent and that said Letters Patent is hereby corrected as shown below:

Column 8, Line 51, claim 5        Delete: "of"

Column 9, Line 9, claim 14        Delete: "with"

Signed and Sealed this
Thirty-first Day of January, 2012

David J. Kappos
*Director of the United States Patent and Trademark Office*